Figure 1:
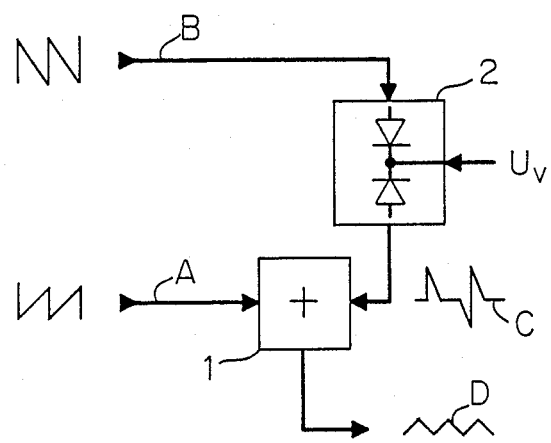

United States Patent [19]

Hartmann et al.

[11] Patent Number: 4,841,251

[45] Date of Patent: Jun. 20, 1989

[54] METHOD OF GENERATING A VOLTAGE WITH A TRIANGULAR SHAPE FROM A SAWTOOTH WAVEFORM

[75] Inventors: Uwe Hartmann; Fritz Ohnemus, both of Villingen-Schwenningen, Fed. Rep. of Germany

[73] Assignee: Deutsche Thomson-Brandt GmbH, Villingen, Fed. Rep. of Germany

[21] Appl. No.: 142,560

[22] Filed: Jan. 7, 1988

[30] Foreign Application Priority Data

Jan. 23, 1987 [DE] Fed. Rep. of Germany ....... 3701927

[51] Int. Cl.⁴ .......................... H03K 5/08; H03K 4/10
[52] U.S. Cl. ..................................... 328/36; 307/261; 307/268; 328/114; 328/181
[58] Field of Search ................... 328/181, 114, 36, 53; 307/261, 260, 268

[56] References Cited

U.S. PATENT DOCUMENTS

| | | | |
|---|---|---|---|
| 3,255,363 | 6/1966 | Stella | 328/36 |
| 3,255,416 | 6/1966 | Stella | 328/36 |
| 3,278,765 | 10/1966 | Mudie | 307/260 |
| 3,441,727 | 4/1969 | Vieth, Jr. | 307/261 |

Primary Examiner—Stanley D. Miller
Assistant Examiner—Richard Roseen
Attorney, Agent, or Firm—Max Fogiel

[57] ABSTRACT

An arrangement for generating a voltage waveform having a triangular shape, in which a first voltage waveform having a sawtooth shape is added to a second voltage that has a sawtooth shape with horizontal components during predetermined intervals of the second voltage waveform. A biased diode bridge applies the horizontal components to the second voltage waveform, which has peaks equal to the peaks of the first voltage waveform. Upon adding the first and second voltage waveforms, a voltage waveform with triangular shape is generated.

11 Claims, 2 Drawing Sheets

METHOD OF GENERATING A VOLTAGE WITH A TRIANGULAR SHAPE FROM A SAWTOOTH WAVEFORM

The invention concerns a method of generating a voltage with a triangular shape. Voltages of this type are necessary to obtain a correction current for the vertical deflection in television receivers. The electron beams are as is known deflected by means of sawtooth deflection currents. Correction circuits are necessary for certain types of picture tube to generate phase-correct carrier waves in relation to the frequency of the deflection currents. Filter circuits and even synchronized oscillator circuits are known. They must, however, be tuned to the carrier wave, requiring additional complicated circuitry with its attendant expense. Especially when a circuit is intended for several different vertical-deflection frequencies, the correction circuits must be matched to each deflection frequency. The use of different deflection frequencies is very common at the present time to obtain higher picture resolution and avoid annoying flicker. Future television receivers will be capable of handling deflection frequencies of 50, 60, 100, or 120 Hz.

The object of the invention is accordingly a method of generating a frequency-independent carrier wave for the purpose of correction that is in the same phase as the vertical-deflection current, with the expense of complicated circuitry eliminated in that no compensation in accordance with the frequency of the deflection current is necessary. This object is attained by the measures recited in the major claim. Further developments of the invention will be evident from the subsidiary claims.

One embodiment of the invention will now be described.

Figure 3:
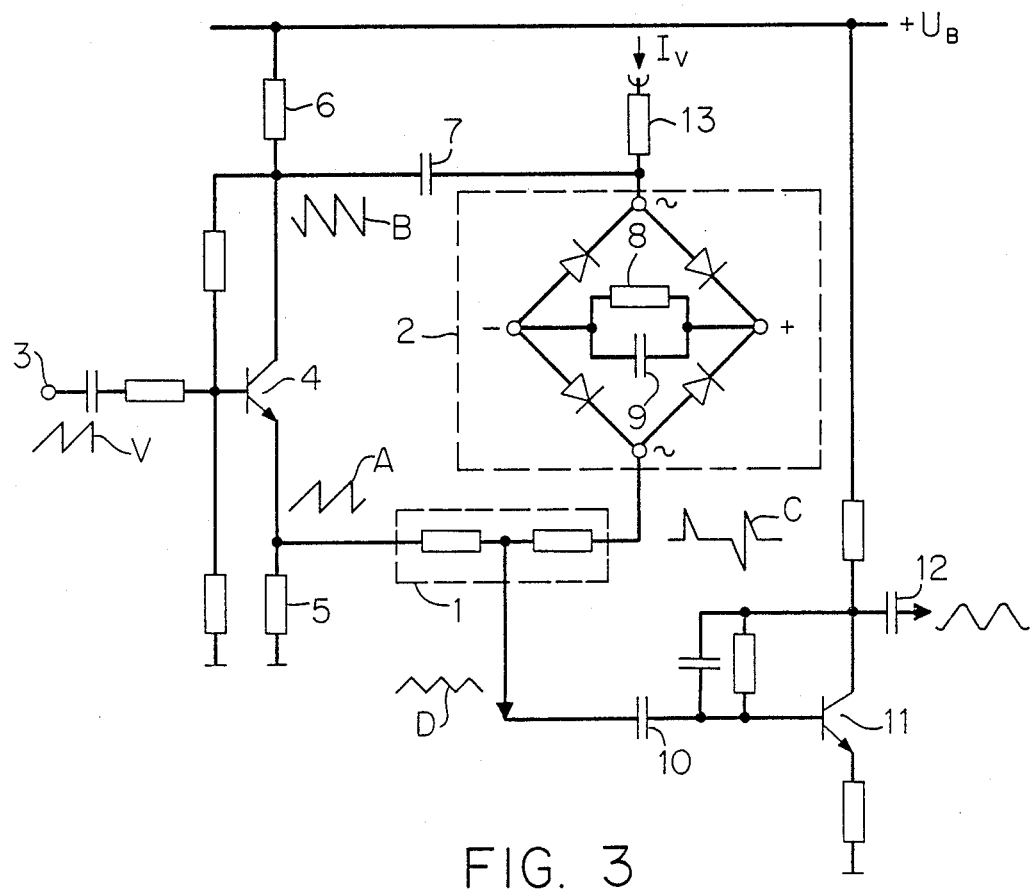
Figure 2:
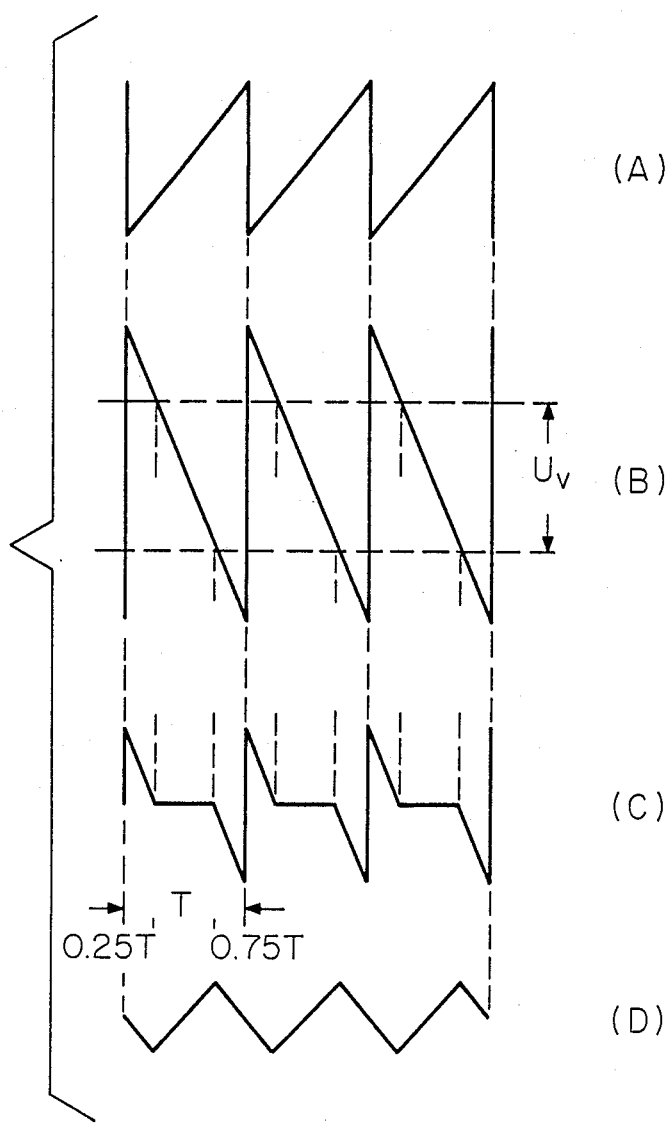

FIG. 1 is a circuit diagram illustrating the principle behind the method being applied for, FIG. 2 contains graphs illustrating how the requisite triangular wave is obtained, and FIG. 3 is a detailed circuit diagram showing how the method is carried out.

A sawtooth voltage is applied to one input terminal of the addition circuit 1 illustrated in FIG. 1. Another sawtooth voltage that is in opposite phase to the first voltage is supplied to a diode bridge 2. Diode bridge 2 is biased with a schematically indicated voltage $U_V$. At the output terminal of diode bridge 2 there occurs a voltage waveform with horizontal components partly dictated by bias voltage $U_V$ that is supplied to the other input terminal of addition circuit 1. The addition results in a triangular voltage at the output terminal of addition circuit 1. This procedure will now be interpreted with reference to the graphs in FIG. 2. Curve A represents the voltage supplied to the input terminal of the addition circuit. Curve B, with a peak level twice as high as that of curve A, is also in opposite phase with it. Curve B arrives at the input terminal of diode bridge 2. Bias voltage $U_V$ is a component of curve B. Only the peaks of curve B travel through diode bridge 2 and arrive at its output terminal, resulting in horizontal sections as illustrated in curve C. The peaks of curve A and curve C must be equal. Adding curves A and C produces a curve D with the desired triangular shape.

The method being applied for will now be described with reference to the embodiment of a circuit illustrated in detail in FIG. 3. The vertical-frequency sawtooth signal V is supplied to the input terminal 3 of an amplification stage 4. A signal A, which is in the same phase as signal V, is intercepted at the emitter resistor 5 of amplification stage 4 and supplied to addition circuit 1. A signal B, which is in opposite phase with signal V, is intercepted at the collector resistor 6 of amplification stage 4 and supplied to diode bridge 2 through a capacitor 7. The peaks of signal B produce a bias for diode bridge 2 at a resistance-capacitance stage 8 and 9. At the output terminal of diode bridge 2 there occurs the signal voltage C, which includes the horizontal sections of the waveform resulting from the bias. Signal C is supplied to the other input terminal of addition circuit 1. A signal D occurs at the output terminal of addition circuit 1 and is supplied to an amplifier 11 through a capacitor 10. The triangular signal is disengaged through a capacitor 12. The central horizontal component of the waveform of signal C will remain extensively of the same duration even when the input voltage oscillates slightly because resistance-capacitance stage 8 and 9 suppresses any concurrent directcurrent voltage. The resistor 8 in resistance-capacitance stage 8 and 9 dictates the discharge time of a capacitor 9, establishing the desired duration of the horizontal component of the waveform of signal C. Due to the concurrent charging voltage of capacitor 9, the input voltage can fluctuate by $\pm 15\%$ for example without disrupting the integrity of signal C. The lack of frequency-dependent components makes this circuitry practical over a wide range of frequencies. Thus, circuits can process frequencies of 40 to 200 Hz. To allow phase shifting of signal D, a bias current $I_V$ can be introduced into diode bridge 2 through a resistor 13. Phase shifts of $\pm 90°$ can accordingly be obtained in signal D.

We claim:

1. A method for generating a voltage waveform having a triangular shape, comprising the steps: supplying a first voltage waveform having a sawtooth shape; supplying a second voltage waveform having a sawtooth shape opposite in phase to the sawtooth shape of said first voltage waveform, forming horizontal components on said second voltage waveform during predetermined intervals of said second voltage waveform, said first voltage waveform and said second voltage waveform having equal peaks; and adding said first voltage waveform to said second voltage waveform with said horizontal components thereon for generating said voltage waveform with triangular shape.

2. A method as defined in claim 1, wherein said horizontal components of said second voltage waveform drop during time 0.25 T to 0.75 T, where T is the period of said second voltage waveform.

3. A method as defined in claim 1, wherein said horizontal components of said second voltage waveform drop during times 0.00 T to 0.25 T and 0.75 T to 1.0 T, where T is the period of said second voltage waveform.

4. A method as defined in claim 2, including the step of suppressing said second voltage waveform during said predetermined intervals for forming said horizontal components.

5. A method as defined in claim 1, including the step of limiting said second voltage waveform during said predetermined intervals for forming said horizontal components.

6. A method as defined in claim 4, wherein said second voltage waveform during said intervals is suppressed by a biased diode bridge.

7. A method as defined in claim 6, wherein said diode bridge is biased by a battery voltage.

8. A method as defined in claim 6, wherein said diode bridge is biased by a parallel circuit having a capacitor and a resistor and being connected to a further capacitor.

9. A method as defined in claim 6, wherein said diode bridge has a first alternating-voltage terminal, said second sawtooth voltage waveform being supplied to said first alternating-voltage terminal, said diode bridge having a second alternating-voltage terminal supplying said second voltage waveform with said horizontal components.

10. A circuit for generating a voltage waveform having a triangular shape, comprising: means for supplying a first voltage waveform having a sawtooth shape; means for supplying a second voltage waveform having a sawtooth shape opposite in phase to the sawtooth shape of said first voltage waveform; a biased diode bridge receiving said second voltage waveform and forming horizontal components on said second voltage waveform during predetermined intervals of said second voltage waveform, said diode bridge having an output; adding means having one terminal connected to the output of said diode bridge, said adding means having another input terminal connected to said means for supplying said first voltage waveform; said adding means having an output for supplying said voltage waveform having a triangular shape.

11. A circuit as defined in claim 10, including means for supplying bias current to said diode bridge for shifting the phase of said waveform with triangular shape at the output of said adding means by ±90°.

* * * * *